US009404947B2

(12) United States Patent
Giuntini et al.

(10) Patent No.: US 9,404,947 B2
(45) Date of Patent: Aug. 2, 2016

(54) SYSTEMS AND METHODS FOR DETECTING POWER QUALITY OF UNINTERRUPIBLE POWER SUPPLIES

(75) Inventors: Lorenzo Giuntini, Ticino (CH); Silvio Colombi, Ticino (CH); Andrea Mannuccini, Ticino (CH)

(73) Assignee: General Electric Company, Schenectady, NY (US)

( * ) Notice: Subject to any disclaimer, the term of this patent is extended or adjusted under 35 U.S.C. 154(b) by 916 days.

(21) Appl. No.: 13/601,841

(22) Filed: Aug. 31, 2012

(65) Prior Publication Data

US 2014/0062201 A1   Mar. 6, 2014

(51) Int. Cl.
*H02J 9/00* (2006.01)
*G01R 19/02* (2006.01)
*G01R 23/20* (2006.01)
*G01R 31/40* (2014.01)
*G01R 19/165* (2006.01)
*G01R 19/25* (2006.01)
*H02J 9/06* (2006.01)

(52) U.S. Cl.
CPC ...... *G01R 19/16547* (2013.01); *G01R 19/2513* (2013.01); *G01R 19/02* (2013.01); *G01R 23/20* (2013.01); *G01R 31/40* (2013.01); *H02J 9/062* (2013.01); *Y10T 307/615* (2015.04)

(58) Field of Classification Search
CPC ................. G01R 19/16547; G01R 19/2513; G01R 19/02; G01R 23/20; G01R 31/40; Y10T 307/615; H02J 9/062
USPC ........................................................ 307/64
See application file for complete search history.

(56) References Cited

U.S. PATENT DOCUMENTS

| 5,229,651 | A | 7/1993 | Baxter, Jr. et al. |
|---|---|---|---|
| 5,377,092 | A | 12/1994 | Rowand, Jr. et al. |
| 5,747,887 | A | 5/1998 | Takanaga et al. |
| 5,969,962 | A | 10/1999 | Gabor |
| 6,295,215 | B1 * | 9/2001 | Faria ............... H02J 9/062 363/124 |
| 6,525,497 | B2 | 2/2003 | Lee et al. |
| 6,629,064 | B1 | 9/2003 | Wall |
| 6,940,187 | B2 | 9/2005 | Escobar et al. |
| 7,372,177 | B2 | 5/2008 | Colombi et al. |
| 8,036,872 | B2 | 10/2011 | Nalse |
| 8,089,789 | B2 | 1/2012 | Prasad et al. |
| 2003/0048006 | A1 | 3/2003 | Shelter, Jr. et al. |

(Continued)

OTHER PUBLICATIONS

Tolbert, L.M et al., Survey of harmonics measurements in electrical distribution systems, Industry Applications Conference, Oct. 1996, IEEE, vol. 4, No., pp. 2333-2339 vol. 4, 6-10.
Rech, C. et al., Line current harmonics reduction in multipulse connection of asymmetrically loaded rectifiers, Industry Applications Conference, Industrial Electronics, IEEE Transactions on, Jun. 2005, vol. 52, No. 3, pp. 640-652.

(Continued)

*Primary Examiner* — Hal Kaplan
(74) *Attorney, Agent, or Firm* — Fletcher Yoder, P.C.

(57) ABSTRACT

A system may include an uninterruptible power supply (UPS) configured to provide power to a load via a bypass feed path coupled to a first power source or via an inverter feed path coupled to a second power source. The UPS may include a controller configured to switch between providing power to the load via the bypass feed path and the inverter feed path based at least in part on a real-time calculation of an amount of voltage distortion present on a voltage signal input to the load via the bypass path. As such, the controller may be configured to provide power to the load via the inverter feed path when the amount of voltage distortion is greater than a limit.

22 Claims, 4 Drawing Sheets

(56) References Cited

U.S. PATENT DOCUMENTS

| | | | |
|---|---|---|---|
| 2005/0012395 A1* | 1/2005 | Eckroad | H02J 3/16 307/44 |
| 2005/0275976 A1 | 12/2005 | Taimela et al. | |
| 2008/0192877 A1 | 8/2008 | Eliezer et al. | |
| 2009/0201703 A1 | 8/2009 | Klikic et al. | |
| 2012/0033323 A1 | 2/2012 | Mathew et al. | |
| 2012/0181871 A1* | 7/2012 | Johansen | H02J 9/062 307/66 |

OTHER PUBLICATIONS

Palma, L.B et al., Real-time detection of oscillations in control loops, Power Engineering, Energy and Electrical Drives (POWERENG), International Conference on, May 2011 vol., No., pp. 1-6, 11-13.

O'Connor, N. et al., Control loop performance assessment: a classification of methods, Proceedings of the Irish Signals and Systems Conference, Jul. 2004, pp. 530-535.

* cited by examiner

US 9,404,947 B2

SYSTEMS AND METHODS FOR DETECTING POWER QUALITY OF UNINTERRUPTIBLE POWER SUPPLIES

BACKGROUND OF THE INVENTION

The subject matter disclosed herein relates to an uninterruptible power supply (UPS) system, and particularly to methods for detecting the voltage quality of a UPS system.

UPS systems generally convert an alternating current (AC) voltage to direct current (DC) voltage using a rectifier, and from DC voltage to a controllable AC voltage using an inverter. As such, UPS systems offer a significant amount of protection because a load can always be fed using the controllable AC voltage output by the inverter. However, UPS systems may have limited efficiency due to all of the components within the rectifier and the inverter, which can result in a higher operation cost, particularly for large UPS systems. To compensate for the limited efficiency associated with UPS systems, the load connected to a UPS system may be fed via a bypass feed path when a utility power source has a power quality that is within certain tolerance levels. That is, the load may be powered directly from the utility power source when its power quality is determined to be within certain limits. By providing power to the load via the bypass path (i.e., economic mode of operation), the UPS system limits the use of the rectifier and inverter in the inverter feed path of the UPS system.

However, while operating in an economic mode of operation (e.g., ECO mode), the UPS system cannot actively condition the AC voltage provided to the load because the AC voltage is being supplied to the load via the utility power source with little conditioning. As such, some distorted AC voltage signals from the utility power source can be input to the load because the distorted AC voltage signals could still be within the power quality tolerance levels mentioned above. These distorted AC voltage signals input to the load are generally undesirable for the load because they could cause damage to the load, cause the load to operate inefficiently, and so forth. Moreover, various power quality standards impose restrictions on the amount of voltage distortion that can be provided to the load.

BRIEF DESCRIPTION OF THE INVENTION

In one embodiment, a method for determining a total harmonic distortion (THD) of a voltage signal may include determining, using a processor, a root-mean-square (RMS) of the voltage signal and generating a reference signal in phase with the voltage signal. The method may then include scaling the reference signal using the RMS of the voltage signal and determining an error signal based at least in part on the scaled reference signal and the voltage signal. After determining the error signal, the method may include determining an RMS of the error signal and determining the THD of the voltage signal based at least in part on the RMS of the error signal and the RMS of the voltage signal.

In another embodiment, a system may include an uninterruptible power supply (UPS) configured to provide power to a load via a bypass feed path coupled to a first power source or via an inverter feed path coupled to a second power source. The UPS may include a controller configured to switch between providing power to the load via the bypass feed path and the inverter feed path based at least in part on a real-time calculation of an amount of voltage distortion present on a voltage signal input to the load via the bypass path. As such, the controller may be configured to provide power to the load via the inverter feed path when the amount of voltage distortion is greater than a limit.

In yet another embodiment, a non-transitory computer readable medium may include instructions to determine a root-mean-square (RMS) of a voltage signal output by an uninterruptible power system (UPS) via a bypass feed path coupled to a power source, generate a reference signal in phase with the voltage signal, scale the reference signal using the RMS of the voltage signal. The non-transitory computer readable medium may then determine an error signal based at least in part on the scaled reference signal and the voltage signal, determine an RMS of the error signal, and determine a total harmonic distortion (THD) of the voltage signal based at least in part on the RMS of the error signal and the RMS of the voltage signal. After determining the THD of the voltage signal, the non-transitory computer readable medium may send a first signal to a first switch coupled to the bypass feed path when the THD of the voltage signal is less than a THD limit, wherein the first signal is configured to close the first switch, thereby providing power to a load coupled to the UPS via the power source.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

The present disclosure is generally directed towards an uninterruptible power supply (UPS) system that may detect voltage distortions in an alternating current (AC) voltage signal output by the UPS system in real-time, or near-instantaneously. In certain embodiments, the UPS system may generate a reference sine wave that may correspond to the output AC voltage signal received by a load via a power source in a bypass feed path of the UPS system. As such, the load may receive its power from the power source, which may be a utility line or the like. The UPS system may then determine a root-mean-square (RMS) of the output AC voltage signal and compare the output AC voltage signal to the reference sine wave scaled by the RMS of the output AC voltage signal to determine an error signal and an RMS of the error signal. Using the RMS of the output AC voltage signal and the RMS of the error signal, the UPS system may then determine a ratio between the RMS of the error signal and the RMS of the output AC voltage signal. The resulting ratio may indicate a total harmonic distortion (THD) of the AC voltage signal output by the UPS system.

Figure 1:
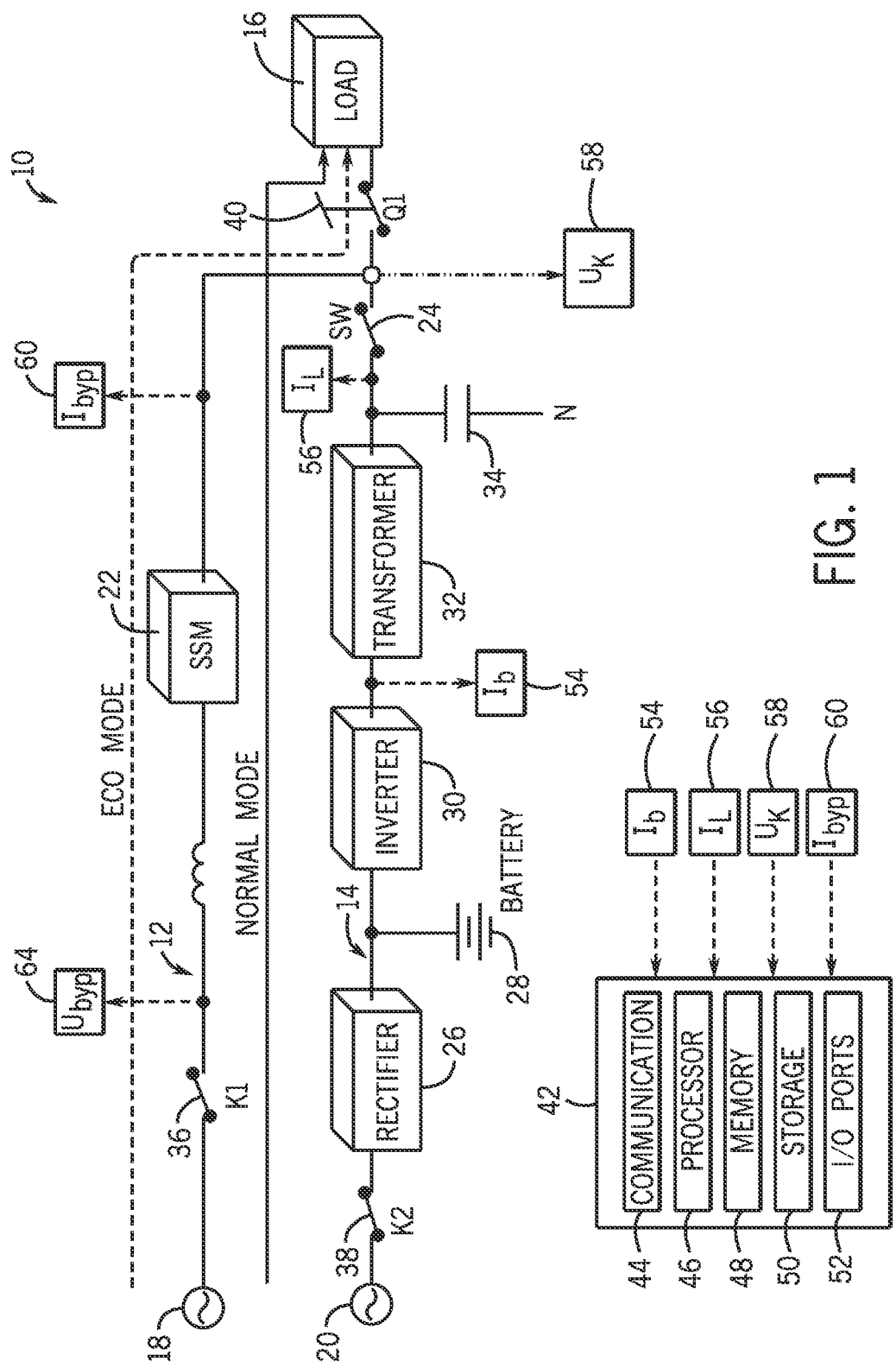
FIG. 1 depicts a one-line diagram of a uninterruptible power supply (UPS) system, in accordance with an embodiment.

Keeping the foregoing in mind, FIG. 1 depicts a one-line diagram of an uninterruptible power supply (UPS) system 10. The UPS system 10 includes a bypass feed path 12 and an inverter feed path 14 that are operable in parallel with each other such that each path may provide power to a load 16. To provide power to the load 16, the bypass feed path 12 and the inverter feed path 14 may be coupled to a power source 18 and a power source 20, respectively. The power source 18 and the power source 20 may be a utility power source or some other alternating current (AC) power source. In one embodiment, the power source 20 for the inverter feed path 14 may be the same as the power source 18 for the bypass feed path 12.

The UPS system 10 may use the bypass feed path 12 and the inverter feed path 14 to operate in an economic (ECO) mode and a normal mode, respectively. That is, the UPS system 10 may operate in the ECO mode by engaging switch 22 (i.e., closing) such that a bypass current may be delivered to the load 16 from the power source 18. Similarly, the UPS system 10 may operate in the normal mode by engaging switch 24 (i.e., closing) such that an inverter current may be delivered to the load 16 from the power source 20. In certain embodiments, the first switch 22 may be a remote controllable static switch module (SSM) and the second switch 24 may be a remote controllable contactor of a type known to one skilled in the art. However, it should be noted that any type of switch or contactor may be used for the first switch 22 and the second switch 24.

The inverter feed path 14 may include a rectifier 26, a battery 28, an inverter 30, an output isolation transformer 32, and filtering capacitors 34. As such, the rectifier 26 may receive AC voltage from the power source 20 and convert it into DC voltage. The inverter 30 may receive the DC voltage from the rectifier 26 or the battery 28, which may also output a DC voltage, and convert the DC voltage into a controllable AC voltage. The controllable AC voltage may then be filtered using the transformer 32 and the capacitors 34. The filtered AC voltage may then be provided to the load 16. Although the inverter feed path is described in FIG. 1 as having the output isolation transformer 32, it should be noted that in some embodiments, the inverter feed path 14 may not include the output isolation transformer 32. As such, the methods described herein may be used for transformer-less UPS systems as well.

The UPS system 10 may also include disconnect switches (K1) 36, (K2) 38, and (Q1) 40, which may provide additional protection and/or control for the UPS system 10. The disconnect switches (K1) 36, (K2) 38, and (Q1) 40 may include manual disconnects.

In one embodiment, the UPS system 10 may include a controller 42. The controller 42 may include a communication component 44, a processor 46, a memory 48, a storage 50, input/output (I/O) ports 52, and the like. The communication component 44 may be a wireless or wired communication component that may facilitate communication between various components (e.g., switches, rectifier, inverter) within the UPS system 10. The processor 46 may be any type of computer processor or microprocessor capable of executing computer-executable code. The memory 48 and the storage 50 may be any suitable articles of manufacture that can serve as media to store processor-executable code. These articles of manufacture may represent computer-readable media (i.e., any suitable form of memory or storage) that may store the processor-executable code used by the processor 46 to perform the presently disclosed techniques. In one embodiment, the control system 42 may analyze an output AC voltage signal ($U_k$) provided to the load 16 via the power source 18 in the bypass feed path 12 and detect an amount of voltage distortion present on the output AC voltage signal. Additional details describing a method in which the control system 42 may use to process the output AC voltage signal ($U_k$) provided by the power source 18 will be discussed below with reference to FIG. 2.

In some embodiments, the controller 42 may receive data related to inverter bridge currents ($I_b$) 54, inverter load currents ($I_L$) 56, an output AC voltage signal ($U_k$) 58, bypass load currents ($I_{byp}$) 60, and bypass input voltages ($U_{byp}$) 64 from any sensor suitable for the intended purpose. Using the received data, the controller 42 may analyze the UPS system 10 and enhance the efficiency of the UPS system 10 by switching between a normal mode of operation and an ECO mode of operation.

During normal operation, the controller 42 may send signals to various components (e.g., rectifier 26, inverter 30) within the UPS system 10 such that the rectifier 26 may convert power received from the power source 20 to regulated DC power to charge the battery 28 as well as supply DC power to the inverter 30. The inverter 30 may then convert the DC power to a frequency regulated (i.e., controllable) AC voltage. If at any time the power source 20 fails to provide power to the rectifier 26, the inverter 30 may draw DC power from the battery 28 and may continue to supply output power to the load 16.

When operating in the ECO mode, the controller 42 may enable the UPS system 10 to feed power to the load 16 via the bypass feed path 12. In one embodiment, the controller 42 may power the load 16 via the bypass feed path 12 when the power quality of AC power (e.g., $U_{byp}$) provided by the power source 18 is within some tolerance levels. As power is fed to the load 16 via the bypass path 12, the controller 42 may constantly monitor the quality of the power from the power source 18. As soon as the power quality of the AC power from the power source 18 falls outside the tolerance levels, the controller 42 may enable the load 16 to receive power from the power source 20 via the inverter feed path 14. As such, the controller 42 may send signals to the SSM 22 to open and may send signals to the rectifier 26 and the inverter 30 to enable the load 16 to receive power via the inverter feed path 14.

While FIG. 1 depicts the UPS system 10 in a one-line diagram form, it should be noted that in certain embodiments, the UPS system 10 may have multiple phases, such as three phases. For example, the output AC power ($U_k$) provided to the load 16 may include any number of phases (e.g., $u_1$, $u_2$, $u_3$). As such, any reference made herein to a current or a voltage in one phase is intended to be a reference to the current and voltage of each phase.

Figure 2:
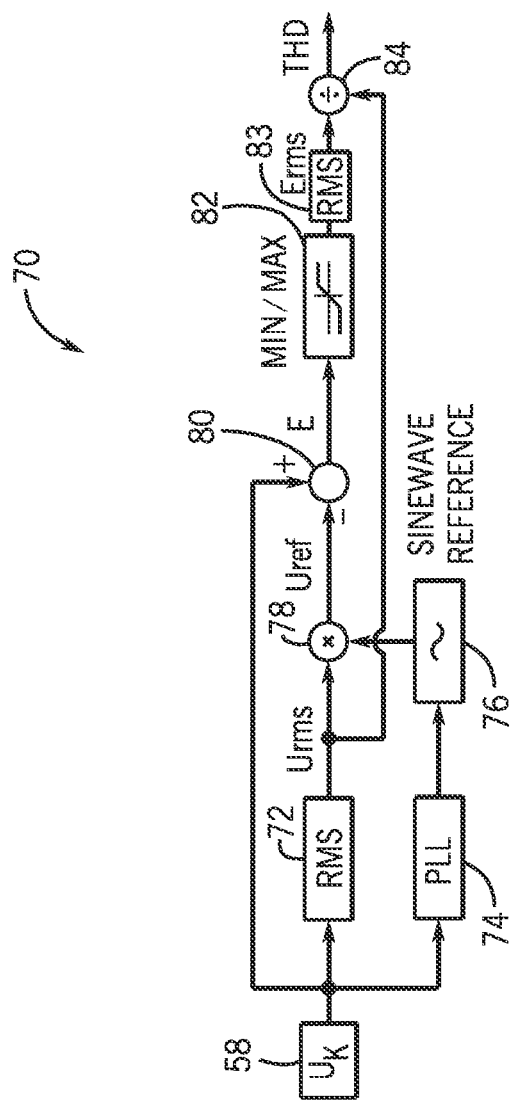
FIG. 2 depicts a control scheme for detecting voltage distortions in the UPS system of FIG. 1, in accordance with an embodiment.

FIG. 2 illustrates a control scheme 70 for detecting voltage distortions in the output AC voltage waveforms ($U_k$) 58 output by the UPS system 10. In one embodiment, the control scheme 70 may be implemented by the controller 42 described above. As such, the controller 42 may provide the output AC voltage ($U_k$) 58 to block 72 and block 74. At block 72, the controller 42 may determine a root-mean-square (RMS) of the output AC voltage ($U_k$) 58. Rather than determining the RMS of the output AC voltage ($U_k$) 58 at the fundamental frequency using a Fast-Fourier Transform (FFT) analysis on the output AC voltage ($U_k$) 58, which is a generally computationally expensive and time intensive process, the UPS system 10 may perform a real-time calculation of the RMS of the output AC voltage ($U_k$) 58 using the control scheme 70. That is, the controller 42 (at block 72) may approximate a fundamental RMS of the output AC voltage ($U_k$) 58 based on a total RMS of the output AC voltage ($U_k$) 58. The fundamental RMS of the output AC voltage ($U_k$) 58 represents the first order waveform (i.e., working frequency) of the output AC voltage ($U_k$) 58. The approximation of the fundamental RMS of the output AC voltage ($U_k$) 58 may have a limited error (~0.05%, in some cases) when the total harmonic distortion (THD) of the output AC voltage ($U_k$) 58 is less than approximately 10%. As such, the controller 42 may consider the RMS of the output AC voltage ($U_k$) 58 to be substantially equal to the fundamental RMS of the output AC voltage ($U_k$) 58. Keeping this in mind, the RMS of the output AC voltage ($U_k$) 58 may be determined according to the following equations.

$$Vout_{RMS} = \text{RMS}(v_{out}(t)) = \sqrt{V_1^2 + \ldots + V_n^2} = V_1\sqrt{1 + THD^2} \quad (1)$$

where $Vout_{RMS}$ represents the total RMS of the output AC voltage ($U_k$) 58, $v_{out}(t)$ represents the output AC voltage ($U_k$) 58, $V_1$ represents an RMS of the output AC voltage ($U_k$) 58 at a fundamental frequency, $V_n$ represents an RMS of the output AC voltage ($U_k$) 58 at an $n^{th}$ order frequency, and THD represents the total harmonic distortion of the output AC voltage ($U_k$) 58.

Referring back to block 74, the controller 42 may apply a Phase-Locked Loop (PLL) algorithm or circuit on the output AC voltage ($U_k$) 58 to generate a sine wave reference 76. By applying the PLL algorithm, the controller 42 may generate a stable sine wave reference 76 that accounts for any hysteretic effect. Further, the sine wave reference 76 may have frequency and phase characteristics that match frequency and phase characteristics of the output AC voltage ($U_k$) 58.

After determining the fundamental RMS of the output AC voltage ($U_k$) 58 and the sine wave reference 76, at block 78, the controller 42 may scale the sine wave reference 76 using the fundamental RMS ($U_{rms}$) of the output AC voltage ($U_k$) 58. As such, the controller 42 may determine a product between the sine wave reference 76 and the fundamental RMS of the output AC voltage ($U_k$) 58. The resulting product may be referred to as a reference voltage waveform ($U_{ref}$), which may represent an expected voltage waveform output by the UPS system 10. Since the reference voltage waveform ($U_{ref}$) is generated based on the sine wave reference 76, the reference voltage waveform (Uref) may not change rapidly due to the PLL's stable sine wave reference 76. The controller 42 may then use the reference voltage waveform ($U_{ref}$) to determine an error signal (E) for the output AC voltage ($U_k$) 58.

As such, at block 80, the controller 42 may calculate the error signal (E) for the output AC voltage ($U_k$) 58. That is, the controller 42 may compute a difference between the output AC voltage ($U_k$) 58 and the reference voltage waveform ($U_{ref}$) determined at block 76. Further to this, at block 82, the controller 42 may limit the error signal (E) between some maximum and minimum values, thereby removing any extreme values from the error signal (E).

The controller 42 may then, at block 83, determine an RMS ($E_{rms}$) of the error signal (E) according to the equation below.

$$\text{RMS}(v_{out}(t) - v_{ref}(t)) \approx \text{RMS}(v_{out}(t) - v_1(t)) = \quad (2)$$
$$\sqrt{Vout_{RMS}^2 - V_1^2} = \sqrt{V_2^2 + \ldots + V_n^2}$$

where $Vout_{RMS}$ represents the total RMS of the output AC voltage ($U_k$) 58, $v_{out}(t)$ represents the output AC voltage ($U_k$) 58, $v_{ref}(t)$ represents the reference voltage waveform ($U_{ref}$), $v_1(t)$ represents a voltage waveform of the output AC voltage ($U_k$) 58 at a fundamental frequency, $V_1$ represents an RMS of the output AC voltage ($U_k$) 58 at the fundamental frequency, and $V_n$ represents an RMS of the output AC voltage ($U_k$) 58 at an $n^{th}$ order frequency.

After determining the RMS ($E_{rms}$) of the error signal (E), at block 84, the controller 42 may determine a total harmonic distortion (THD) of the output AC voltage ($U_k$) 58. The THD of the output AC voltage ($U_k$) 58 may correspond to the voltage distortions within the output AC voltage ($U_k$) 58. In one embodiment, the controller 42 may compute a ratio between the RMS ($E_{rms}$) of the error signal (E) and the RMS of the output AC voltage ($U_k$) 58 according to the equation below.

$$THD = \frac{\sqrt{V_2^2 + \ldots + V_n^2}}{V_1} \approx \frac{\text{RMS}(v_{out}(t) - v_{ref}(t))}{Vout_{RMS}} \quad (3)$$

where $Vout_{RMS}$ represents the total RMS of the output AC voltage ($U_k$) 58, $v_{out}(t)$ represents the output AC voltage signal ($U_k$) 58, $v_{ref}(t)$ represents the reference voltage waveform ($U_{ref}$), $V_1$ represents an RMS of the output AC voltage ($U_k$) 58 at the fundamental frequency, and $V_n$ represents an RMS of the output AC voltage ($U_k$) 58 at an $n^{th}$ n order frequency.

Traditional THD computation techniques are based on FFT. While FFT is regarded as efficient, it may prove to be computationally challenging for systems with real-time constraints such as a Digital Signal Processor (DSP) controlling the UPS system 10. As such, computing the THD of the UPS system 10 using FFT is typically performed off-line in background (i.e., using free processing time over a longer period). By employing the control scheme 70 described above, the controller 42 may provide a computationally lightweight process for determining and detecting voltage distortions within the output AC voltage ($U_k$) 58. Particularly, the RMS values of the output AC voltage ($U_k$) 58 may be computed in real-time (e.g., using a sliding-window approach). As such, the controller 42 may provide real-time detection of voltage distortion.

Further, the controller 42 may also detect RMS variations, phase shifts, and phase oscillations associated with the output AC voltage ($U_k$) 58 by comparing the reference voltage waveform ($U_{ref}$) with the output AC voltage ($U_k$) 58 (block 80). The improved detection may ensure that the UPS system 10 provides high quality power to the load 16 via the inverter feed path 14 when the power from the bypass feed path 12 does not meet certain quality demands.

Moreover, by generating the sine wave reference ($U_{ref}$) 76 in phase with the output AC voltage ($U_k$) 58, the controller 42 may detect when the output AC voltage ($U_k$) 58 drifts with respect to the frequency or phase of the sine wave reference in real-time. Likewise, by comparing the sine wave reference ($U_{ref}$) 76 with the output AC voltage ($U_k$) 58, the controller 42 may also detect when the voltage of the output AC voltage ($U_k$) 58 drifts sharply away from the sine wave reference ($U_{ref}$) 76 (i.e., expected voltage waveform). In any of these events, the controller 42 may switch between operating modes or isolate the load 16 from the USP system 10.

Figure 3:
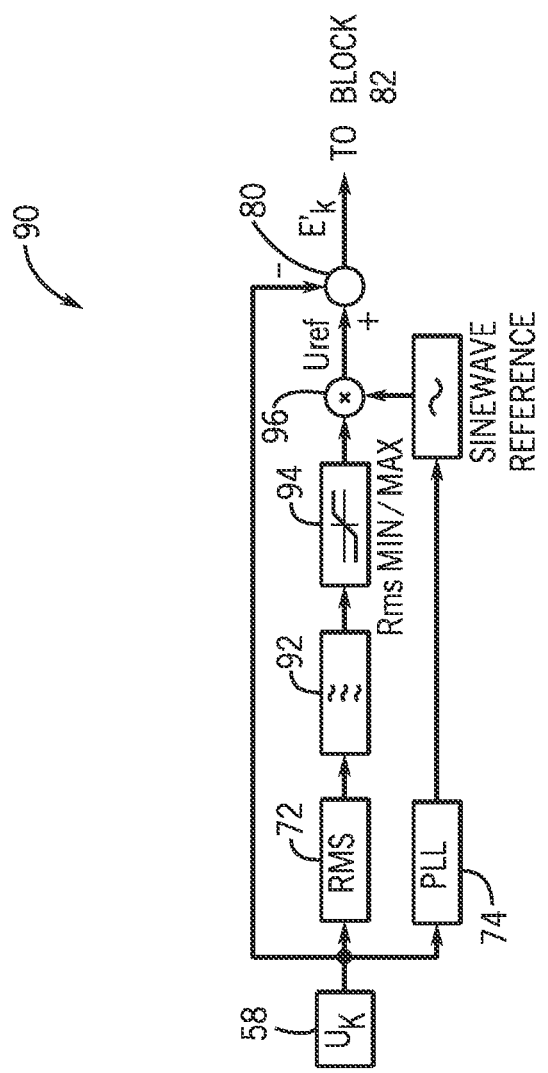
FIG. 3 depicts a modification to the control scheme of FIG. 2, in accordance with an embodiment.

In one embodiment, the control scheme 70 may be modified as shown in FIG. 3. The modified control scheme 90 may be used to introduce detection of RMS variations of the output voltage beyond some limits. The limits may be predefined or computed based on the performance of the UPS system 10.

For example, referring to the modified control scheme 90, at block 72, the controller 42 may determine the RMS of the output AC voltage ($U_k$) 58 similar to as described above. The controller 42 may then input the RMS of the output AC voltage ($U_k$) 58 to block 92. At block 92, the controller 42 may apply a low-pass filter (e.g., 1-50 Hz) to the RMS of the output AC voltage ($U_k$) 58.

The controller 42 may then provide the filtered RMS error signal ($E_{rms}$) (i.e., average RMS component) to block 94, which may limit the RMS error signal ($E_{rms}$) between some maximum and minimum values. At block 96, the controller 42 may determine a product of the sine wave reference 76 and the output of block 94. The product of the sine-wave reference 76 and the output of block 94, or the reference voltage waveform ($U_{ref}$), may be used to determine an error signal (E) for the output AC voltage ($U_k$) 58. For instance, at block 80, the controller 42 may compute a difference between the output AC voltage ($U_k$) 58 and the reference voltage waveform ($U_{ref}$) to determine the error signal (E) for the output AC voltage ($U_k$) 58. Any RMS variation of the output voltage ($U_k$) 58 beyond the limits would be result in an increased error signal (E), thereby allowing detection of such condition.

Although the controller 42 has generally been described as employing the control scheme 70 to determine the THD of the output AC voltage ($U_k$) 58 and the RMS ($E_{rms}$) of the error signal (E) associated with the output AC voltage ($U_k$) 58, it should be noted that the controller 42 may also be used to compute an RMS of the derivative of the output AC voltage ($U_k$) 58 as shown in the equations below.

$$Vout_{RMS} = \text{RMS}(v_{out}(t)) = \sqrt{\sum_{i=1}^{n} V_i^2} \quad (4)$$

$$Vd_{RMS} = \text{RMS}\left(\frac{dv_{out}(t)}{dt}\right) = \sqrt{\sum_{i=1}^{n} (i\omega V_i)^2} \quad (5)$$

$$\sqrt{\left(\frac{Vd_{RMS}}{\omega}\right)^2 - Vout_{RMS}^2} = \sqrt{\sum_{i=1}^{n} (i^2 - 1)V_i^2} \quad (6)$$

where $Vout_{RMS}$ represents the total RMS of the output AC voltage ($U_k$) 58, $v_{out}(t)$ represents the output AC voltage signal ($U_k$) 58, $v_{ref}(t)$ represents the reference voltage waveform ($U_{ref}$), $V_1$ represents an RMS of the output AC voltage ($U_k$) 58 at the fundamental frequency, $V_n$ represents an RMS of the output AC voltage ($U_k$) 58 at an $n^{th}$ order frequency, $dVout_{RMS}$ represents the derivative of the total RMS of the output AC voltage ($U_k$) 58.

As shown above, the Equations 4-6 may depict how the RMS of the voltage derivative of the output AC voltage ($U_k$) 58 relates to its specific harmonic components with the square of its order. As such, the RMS of the voltage derivative of the output AC voltage ($U_k$) 58 may provide a qualitative indication of the harmonic content in the output AC voltage ($U_k$) 58. In this manner, the controller 42 may receive information related on the composition of the voltage distortions related to the various harmonic components in the output AC voltage ($U_k$) 58. Moreover, at a given distortion level, the RMS of the voltage derivative may highlight the contribution of higher order harmonics. Since the allowable amplitude for each specific harmonic typically decreases with the order of the harmonic, in certain embodiments, the controller 42 may combine the RMS of error and the RMS of the voltage derivative to estimate voltage distortion and harmonic content.

Figure 4:
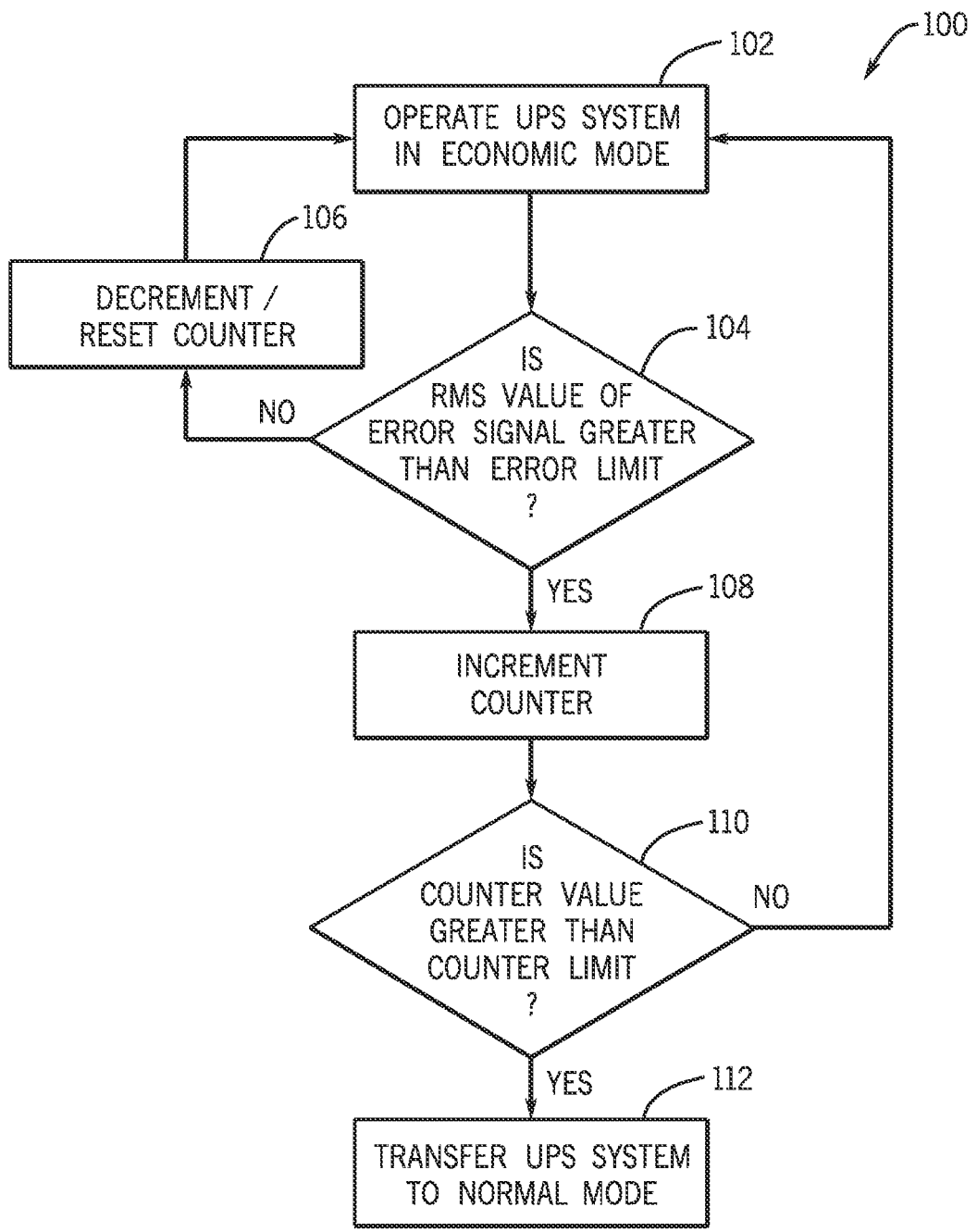
FIG. 4 depicts a flow chart for switching the UPS system of FIG. 1 from an economic mode of operation to a normal mode of operation, in accordance with an embodiment.

In addition to determining the error signal (E) for the output AC voltage ($U_k$) 58, the controller 42 may determine values for other characteristics of the UPS system 10 in real-time. For example, the controller 42 may use a real-time RMS error signal ($E_{rms}$) (i.e., RMS of the error signal (E) associated with the output AC voltage ($U_k$) 58) to determine when the UPS system 10 should operate in the ECO mode or the normal mode. FIG. 4 illustrates a flow chart that depicts an embodiment of a method 100 for switching operation modes in the UPS system 10.

At block 102, the controller 42 may operate the UPS system 10 in an economic (ECO) mode. As mentioned above, when operating in the ECO mode, the controller 42 may provide power to the load 16 via the bypass feed path 12 when the power quality of AC power (e.g., $U_{byp}$) provided by the power source 18 is within some tolerance levels.

In one embodiment, the controller 42 may determine the RMS ($E_{rms}$) of the error signal (E), which may correspond to the difference between the output AC voltage ($U_k$) 58 and the reference voltage waveform ($U_{ref}$), in real-time. The RMS ($E_{rms}$) of the error signal (E) may directly relate to an amount of voltage distortion within the output AC voltage ($U_k$) 58. As such, the controller 42 may use the RMS ($E_{rms}$) of the error signal (E) to approximate the amount of voltage distortion in the output AC voltage ($U_k$) 58.

Keeping the foregoing in mind, at block 104, the controller 42 may compare the RMS ($E_{rms}$) of the error signal (E) to some error limit. If the RMS ($E_{rms}$) of the error signal (E) is not greater than the error limit, the controller 42 may proceed to block 106. At block 106, the controller 42 may decrement or reset a counter and continue to operate the UPS system 10 in the ECO mode.

If, however, the RMS ($E_{rms}$) of the error signal (E) is greater than (or equal to) the error limit, the controller 42 may proceed to block 108. At block 108, the controller 42 may increment the counter and proceed to block 110.

At block 110, the controller 42 may compare the counter to a counter limit. If the counter is not greater than the counter limit, the controller 42 may return to block 102 and continue to operate the UPS system 10 in the ECO mode. If, however, the counter is greater than (or equal to) the counter limit, the controller 42 may proceed to block 112 and operate the UPS system 10 in a normal mode. As such, the controller 42 may send signals to various components (e.g., rectifier 26, inverter 30) within the UPS system 10 such that the load 16 may receive power via the inverter feed path 14.

In certain embodiments, the counter described above may be associated with a timer. In this manner, the controller 42 may operate the UPS system 10 in the ECO mode for a certain period of time while the RMS ($E_{rms}$) of the error signal (E) is greater than (or equal to) the error limit or while the voltage distortions in the output AC voltage ($U_k$) 58 are greater than some limit. However, if the voltage distortions in the output AC voltage (Uk) 58 are greater than some limit for some period of time (i.e., counter limit), the controller 42 may operate the UPS system 10 in the normal mode to protect the load 16 from being exposed to the voltage distortions for longer than the period of time (i.e., counter limit).

Although the method 100 described above has been discussed with respect to the RMS ($E_{rms}$) of the error signal (E) and some error limit (block 104), it should be noted that in other implementations method 100 may be modified such that the controller 42 switches the UPS system 10 between ECO mode and normal mode based on other factors. For instance, the controller 42 may increment the counter (at block 108) based on a comparison between the THD of the output AC voltage ($U_k$) 58 and a THD limit, an amount of variations in the RMS of the output AC voltage ($U_k$) 58, phase shifts that occur in the output AC voltage ($U_k$) 58 as compared to the reference voltage waveform ($U_{ref}$), phase oscillations that occur in the output AC voltage ($U_k$) 58 as compared to the reference voltage waveform ($U_{ref}$), and the like.

Technical effects of the present disclosure include the real-time detection of voltage distortions, instantaneous phase shifts, and RMS variations of the AC voltage output 58 of the UPS system 10 during a high-efficiency operation (i.e., ECO mode). Since the controller 42 may detect these situations in real-time, the controller 42 may transfer to the normal mode to protect the load 16 from those disturbances. Additionally, technical effects include the detection of oscillations in the inverter 30 during the normal mode operation. In fact, oscillations in the inverter control loop typically result in distortion of output waveform. As such, the techniques described herein may be employed to detect this distortion. As a result, the load 16 and the UPS system 100 itself may be safeguarded from such oscillations, which may cause premature aging or failure of components (e.g., capacitors) in the UPS system 10. Further, technical effects of the present disclosure include providing a computationally lightweight implementation method to calculate voltage distortions in the UPS system 10. As a result, the reduced computations may translate into a cost-effective implementation for additional control/diagnostic functions.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method, comprising:
   determining, using a processor, a root-mean-square (RMS) of a voltage signal;
   generating a reference signal in phase with the voltage signal;
   scaling the reference signal based at least in part on the RMS of the voltage signal;
   determining an error signal based at least in part on the scaled reference signal and the voltage signal;
   determining an RMS of the error signal; and
   determining a total harmonic distortion (THD) of the voltage signal based at least in part on the RMS of the error signal and the RMS of the voltage signal.

2. The method of claim 1, wherein generating the reference signal comprises generating a sine wave in phase with the voltage signal using a phase-locked loop circuit.

3. The method of claim 1, wherein scaling the reference signal comprises calculating a product between the reference signal and the RMS of the voltage signal.

4. The method of claim 1, wherein determining the error signal comprises determining a difference between the voltage signal and the scaled reference signal.

5. The method of claim 1, wherein determining the THD of the voltage signal comprises determining a ratio between the RMS of the error signal and the RMS of the voltage signal.

6. The method of claim 1, wherein determining the RMS of the error signal comprises:
   limiting the error signal between a minimum value and a maximum value; and
   determining the RMS of the error signal based at least in part on the limited error signal.

7. A system, comprising:
   an uninterruptible power supply (UPS) configured to provide power to a load via a bypass feed path coupled to a first power source or via an inverter feed path coupled to a second power source, wherein the inverter feed path comprises at least a rectifier and an inverter, and wherein the UPS comprises:
      a controller configured to switch between providing power to the load via the bypass feed path and the inverter feed path based at least in part on a real-time calculation of an amount of voltage distortion present on a voltage signal input to the load via the bypass path, wherein the controller is configured to provide power to the load via the inverter feed path when the amount of voltage distortion is greater than a limit.

8. The system of claim 7, wherein the first power source and the second power source are the same.

9. The system of claim 7, wherein the controller is configured to provide power to the load via the inverter feed path by opening a first switch on the bypass feed path and closing a second switch on the inverter feed path.

10. The system of claim 9, wherein the first switch is a static switch module.

11. The system of claim 7, wherein the controller is configured to make the real-time calculation of the amount of the voltage distortion present on the voltage signal by:
    scaling a reference signal in phase with the voltage signal based at least in part on an RMS of the voltage signal;
    determining an error signal based at least in part on the scaled RMS of the voltage signal and the voltage signal; and
    determining the amount of the voltage distortion based at least in part on the RMS of the error signal and the RMS of the voltage signal.

12. The system of claim 7, wherein the controller is configured to detect RMS variations, phase shifts, and phase oscillations in the voltage signal based at least in part on an RMS of the voltage signal, a reference signal in phase with the voltage signal, and the voltage signal.

13. A non-transitory computer readable medium, having computer executable code stored thereon, the code comprising instructions to:
    determine a root-mean-square (RMS) of a voltage signal output by an uninterruptible power system (UPS) via a bypass feed path coupled to a power source;
    generate a reference signal in phase with the voltage signal;
    scale the reference signal based at least in part on the RMS of the voltage signal;
    determine an error signal based at least in part on the scaled reference signal and the voltage signal;
    determine an RMS of the error signal;
    determine a total harmonic distortion (THD) of the voltage signal based at least in part on the RMS of the error signal and the RMS of the voltage signal; and
    send a first signal to a first switch coupled to the bypass feed path when the THD of the voltage signal is less than a THD limit, wherein the first signal is configured to close the first switch, thereby providing power to a load coupled to the UPS via the power source.

14. The non-transitory computer readable medium of claim 13, wherein the reference signal is generated using a Phase-Locked Loop (PLL) circuit.

15. The non-transitory computer readable medium of claim 13, wherein the scaled reference signal is determined by:
    applying a low-pass filter to the RMS of the voltage signal to generate a filtered RMS of the voltage signal; and calculating a product between the reference signal and the filtered RMS of the voltage signal.

16. The non-transitory computer readable medium of claim 13, wherein the computer executable code comprises instructions to:
   send a second signal to the first switch coupled to the bypass feed path when the RMS of the error signal is greater than an error limit for an amount of time that is greater than a time limit, wherein the second signal is configured to open the first switch; and
   send a third signal to a second switch coupled to an inverter feed path comprising at least a rectifier and an inverter, wherein the third signal is configured to close the second switch, thereby providing a controllable power to the load of the UPS via the inverter.

17. The non-transitory computer readable medium of claim 13, wherein the computer executable code comprises instructions to:
   send a second signal to the first switch coupled to the bypass feed path when the THD of the voltage signal is greater than the THD limit for an amount of time that is greater than the time limit, wherein the second signal is configured to open the first switch; and
   send a third signal to a second switch coupled to an inverter feed path comprising at least a rectifier and an inverter, wherein the third signal is configured to close the second switch, thereby providing a controllable power to the load of the UPS via the inverter.

18. The non-transitory computer readable medium of claim 13, wherein the instructions to determine the RMS of the voltage signal output by the UPS via the bypass feed path comprises instructions to solve:

$$Vout_{RMS} = \text{RMS}(v_{out}(t)) = \sqrt{V_2^2 + \ldots + V_n^2}$$

where $Vout_{RMS}$ represents the RMS of the voltage signal, $v_{out}(t)$ represents the voltage signal, $V_1$ represents an RMS of the voltage signal at a fundamental frequency, and $V_n$ represents an RMS of the voltage signal at an $n^{th}$ order frequency.

19. The non-transitory computer readable medium of claim 13, wherein the instructions to determine the THD of the voltage signal comprises instructions to solve:

$$THD = \frac{\sqrt{V_2^2 + \ldots + V_n^2}}{V_1} \approx \frac{\text{RMS}(v_{out}(t) - v_{ref}(t))}{Vout_{RMS}}$$

where $Vout_{RMS}$ represents the RMS of the voltage signal, $v_{out}(t)$ represents the voltage signal, $v_{ref}(t)$ represents the reference signal, $V_1$ represents an RMS of the voltage signal at a fundamental frequency, and represents an RMS of the voltage signal at an $n^{th}$ order frequency.

20. The method of claim 1, wherein the processor is configured to execute computer executable code stored on a non-transitory computer readable medium, wherein the code comprises instructions to:
   determine the root-mean-square (RMS) of the voltage signal output by an uninterruptible power system (UPS) via a bypass feed path coupled to a power source;
   generate the reference signal in phase with the voltage signal;
   scale the reference signal based at least in part on the RMS of the voltage signal;
   determine the error signal based at least in part on the scaled reference signal and the voltage signal;
   determine the RMS of the error signal;
   determine the total harmonic distortion (THD) of the voltage signal based at least in part on the RMS of the error signal and the RMS of the voltage signal; and
   send a first signal to a first switch coupled to the bypass feed path when the THD of the voltage signal is less than a THD limit, wherein the first signal is configured to close the first switch, thereby providing power to a load coupled to the UPS via the power source.

21. The system of claim 7, wherein the controller is configured to determine the amount of voltage distortion by:
   determining a root-mean-square (RMS) of a voltage signal;
   generating a reference signal in phase with the voltage signal;
   scaling the reference signal based at least in part on the RMS of the voltage signal;
   determining an error signal based at least in part on the scaled reference signal and the voltage signal;
   determining an RMS of the error signal; and
   determining a total harmonic distortion (THD) of the voltage signal based at least in part on the RMS of the error signal and the RMS of the voltage signal.

22. The system of claim 7, wherein the controller is configured to execute computer executable code stored on a non-transitory computer readable medium, wherein the code comprises instructions to:
   determine a root-mean-square (RMS) of a voltage signal output by the UPS via a bypass feed path coupled to a power source;
   generate a reference signal in phase with the voltage signal;
   scale the reference signal based at least in part on the RMS of the voltage signal;
   determine an error signal based at least in part on the scaled reference signal and the voltage signal;
   determine an RMS of the error signal;
   determine a total harmonic distortion (THD) of the voltage signal based at least in part on the RMS of the error signal and the RMS of the voltage signal; and
   send a first signal to a first switch coupled to the bypass feed path when the THD of the voltage signal is less than a THD limit, wherein the first signal is configured to close the first switch, thereby providing power to a load coupled to the UPS via the power source.

* * * * *